(12) United States Patent
Kubo et al.

(10) Patent No.: US 8,916,905 B2
(45) Date of Patent: Dec. 23, 2014

(54) PHOTOELECTRIC CONVERSION DEVICE

(75) Inventors: Shintaro Kubo, Higashiomi (JP); Shuji Nakazawa, Gyeonggi-do (KR); Rui Kamada, Higashiomi (JP); Seiji Oguri, Higashiomi (JP); Shinnosuke Ushio, Higashiomi (JP); Shuichi Kasai, Kagoshima (JP); Seiichiro Inai, Omihachiman (JP)

(73) Assignee: KYOCERA Corporation, Kyoto (JP)

( * ) Notice: Subject to any disclaimer, the term of this patent is extended or adjusted under 35 U.S.C. 154(b) by 61 days.

(21) Appl. No.: 13/643,499

(22) PCT Filed: Apr. 22, 2011

(86) PCT No.: PCT/JP2011/059920
§ 371 (c)(1),
(2), (4) Date: Oct. 25, 2012

(87) PCT Pub. No.: WO2011/136140
PCT Pub. Date: Nov. 3, 2011

(65) Prior Publication Data
US 2013/0037901 A1 Feb. 14, 2013

(30) Foreign Application Priority Data

Apr. 27, 2010 (JP) ................................ 2010-101761
Dec. 17, 2010 (JP) ................................ 2010-281565

(51) Int. Cl.
*H01L 31/107* (2006.01)
*H01L 31/0384* (2006.01)
*H01L 21/02* (2006.01)
*H01L 27/142* (2014.01)
*H01L 31/032* (2006.01)
*H01L 31/0749* (2012.01)
*H01L 25/00* (2006.01)

(52) U.S. Cl.
CPC ........ *H01L 27/1423* (2013.01); *H01L 31/0384* (2013.01); *H01L 21/02614* (2013.01); *H01L 21/02568* (2013.01); *H01L 31/0322* (2013.01); *Y02E 10/541* (2013.01); *H01L 21/02628* (2013.01); *H01L 31/0749* (2013.01)
USPC ............ 257/186; 257/E31.058; 257/E25.007; 257/E27.124; 257/E27.125; 257/E25.009; 136/243

(58) Field of Classification Search
USPC .......... 257/186, 233, 292, E33.076, E31.058, 257/E31.063, E31.115, E25.009, E25.032, 257/E27.124, E27.125; 136/243
See application file for complete search history.

(56) References Cited

U.S. PATENT DOCUMENTS 5,981,868 A * 11/1999 Kushiya et al. ................ 136/262
6,534,704 B2 * 3/2003 Hashimoto et al. ........... 136/265

(Continued)

FOREIGN PATENT DOCUMENTS

EP 2590224 A1 5/2013
EP 2645422 A1 10/2013

(Continued)

OTHER PUBLICATIONS

Alberts. Band gap engineering in polycrystaline Cu(In,Ga)(Se,S)2 Materials, Science and Engineering B107 (2004), pp. 139-147.*

(Continued)

*Primary Examiner* — Galina Yushina
(74) *Attorney, Agent, or Firm* — Procopio, Cory, Hargreaves & Savitch LLP

(57) ABSTRACT

It is an object to provide a photoelectric conversion device with high photoelectric conversion efficiency that improves reliability by increasing contact force between a light absorbing layer and an electrode layer. The photoelectric conversion device includes an electrode layer, and a light absorbing layer located on the electrode layer. The light absorbing layer contains a compound semiconductor. The light absorbing layer comprises a first layer close to the electrode layer and a second layer located on the first layer. The first layer has a void ratio lower than that of the second layer.

7 Claims, 4 Drawing Sheets

(56) References Cited

U.S. PATENT DOCUMENTS

| | | | |
|---|---|---|---|
| 2002/0134426 A1* | 9/2002 | Chiba et al. | 136/263 |
| 2007/0163637 A1 | 7/2007 | Robinson et al. | |
| 2009/0211638 A1* | 8/2009 | Park et al. | 136/262 |
| 2010/0154872 A1* | 6/2010 | Jun et al. | 136/252 |
| 2010/0224249 A1* | 9/2010 | Fukunaga et al. | 136/259 |
| 2010/0300529 A1* | 12/2010 | Kawahara et al. | 136/256 |
| 2011/0048524 A1* | 3/2011 | Nam et al. | 136/256 |

FOREIGN PATENT DOCUMENTS

| | | |
|---|---|---|
| JP | H10-321885 A | 12/1998 |
| JP | H11-177112 A | 7/1999 |
| JP | 2000-156517 A | 6/2000 |
| JP | 2004-079858 A | 3/2004 |
| JP | 2010-033915 A | 2/2010 |
| WO | 2009/087848 A1 | 7/2009 |
| WO | 2011/040272 A1 | 4/2011 |
| WO | 2011/052616 A1 | 5/2011 |

OTHER PUBLICATIONS

Heath et al. Effect of Ga content on defects states in CuInGaSe photovoltaic devices. Applied Physics Letters, vol. 80, No. 24, 2002, pp. 4540-4542.*

International Preliminary Report on Patentability issued for International Application No. PCT/JP2011/059920.

Office Action dated Aug. 6, 2013, issued in counterpart Japanese application No. 2012-512816.

Extended European Search Report dated Mar. 19, 2014 issued in counterpart European patent Application No. 11774922.6.

* cited by examiner

F I G . 5
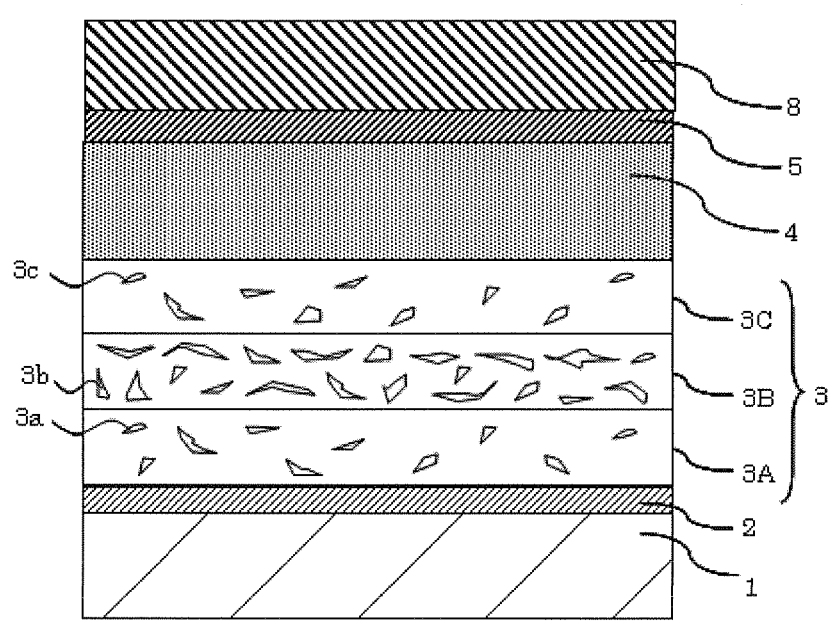

PHOTOELECTRIC CONVERSION DEVICE

TECHNICAL FIELD

The present invention relates to a photoelectric conversion device.

BACKGROUND ART

Some photoelectric conversion devices include a light absorbing layer comprised of a chalcopyrite-based Group I-III-VI compound semiconductor such as CIGS. As an example, these photoelectric conversion devices include a first electrode layer to become a rear surface electrode provided on a substrate, and the light absorbing layer comprised of a Group I-III-VI compound semiconductor and provided on the first electrode layer. Further, a transparent second electrode layer comprised of ZnO and the like is formed over the light absorbing layer while a buffer layer comprised of ZiS, CdS and the like is placed between the light absorbing layer and the second electrode layer.

As one of ways to enhance the photoelectric conversion efficiency of these photoelectric conversion devices, the size of crystal grains of the semiconductor contained in the light absorbing layer is increased. Japanese Patent Application Laid-Open No. 2000-156517 describes a technique of forming a light absorbing layer with large crystal grains.

However, if the light absorbing layer contains large crystal grains, contact force of the light absorbing layer to the electrode layer is reduced to make the light absorbing layer peel off the electrode layer easily. There arises a fear that this peel-off becomes a remarkable matter if the light absorbing layer is processed at a higher temperature in order to increase the size of the crystal grains in the light absorbing layer.

It is an object of the present invention to provide a photoelectric conversion device with high photoelectric conversion efficiency that increases reliability by increasing contact force between a light absorbing layer and an electrode layer.

SUMMARY OF THE INVENTION

A photoelectric conversion device according to an embodiment of the present invention includes an electrode layer, and a light absorbing layer located on the electrode layer. The light absorbing layer contains a compound semiconductor. In the photoelectric conversion device of the present embodiment, the light absorbing layer comprises a first layer close to the electrode layer and a second layer located on the first layer. Further, in the photoelectric conversion device of the present embodiment, the first layer has a void ratio lower than that of the second layer.

The photoelectric conversion device of an embodiment of the present invention forms close contact between the light absorbing layer and the electrode layer easily. So, in the present embodiment, the light absorbing layer is unlikely to peel off the electrode layer, thereby increasing reliability. Further, provision of voids in the second layer enhances light trapping effect. As a result, the present embodiment is capable of enhancing photoelectric conversion efficiency.

BRIEF DESCRIPTION OF DRAWINGS

FIG. 5 is a schematic sectional view for explaining the different embodiment of the photoelectric conversion device.

EMBODIMENT(S) FOR CARRYING OUT THE INVENTION

Figure 1:
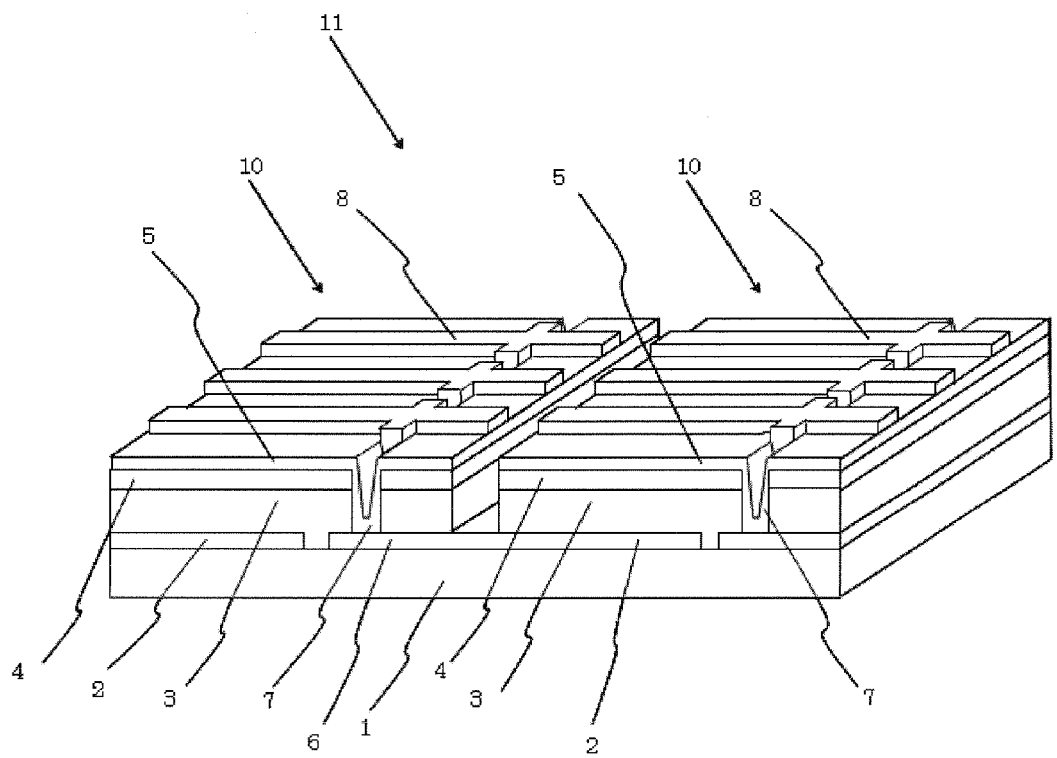
FIG. 1 is a perspective view showing an example of an embodiment of a photoelectric conversion device.

Embodiments of a photoelectric conversion device of the present invention are described in detail below by referring to the drawings.

A photoelectric conversion device 10 of an embodiment of the present invention includes a substrate 1, a first electrode layer 2, a light absorbing layer 3, a buffer layer 4, and a second electrode layer 5.

As shown in FIG. 1, a plurality of the photoelectric conversion devices 10 are arranged in one direction to form a photoelectric conversion module 11. The photoelectric conversion device 10 further includes a third electrode layer 6 spaced apart from the first electrode layer 2 and provided on a side of the light absorbing layers 3 close to the substrate 1. Regarding adjacent photoelectric conversion devices 10, the second electrode layer 5 and the third electrode layer 6 are electrically connected through a connecting conductor 7 provided in the light absorbing layers 3. The third electrode layer 6 also functions as the first electrode layer 2 of the adjacent photoelectric conversion device 10, thereby forming series connection between the adjacent photoelectric conversion devices 10. In one photoelectric conversion device 10, the connecting conductor 7 is provided to divide each of the light absorbing layer 3 and the buffer layer 4. In the photoelectric conversion device 10, the light absorbing layer 3 and the buffer layer 4 placed between the first and second electrode layers 2 and 5 realize photoelectric conversion. Additionally, in the present embodiment, power collecting electrode 8 is provided on the second electrode layer 5.

The substrate 1 is provided to support the photoelectric conversion device 10. Examples of a material for the substrate 1 include glass, ceramic, resin, and metal.

As for the first and third electrode layers 2 and 6, a conductor containing molybdenum (Mo), aluminum (Al), titanium (Ti), or gold (Au) is applicable, for example. The first and third electrode layers 2 and 6 are formed on the substrate 1 by sputtering method or vapor deposition method, for example.

The light absorbing layer 3 is provided to absorb light, and further, work cooperatively with the buffer layer 4 to realize photoelectric conversion. The light absorbing layer 3 is provided on the first and third electrode layers 2 and 6. The light absorbing layer 3 contains a Group I-III-VI compound semiconductor. The Group I-III-VI compound semiconductor mentioned here is a compound semiconductor of a Group I-B element (also called a Group 11 element), a group III-B element (also called a Group 13 element), and a group VI-B element (also called a Group 16 element). This compound semiconductor has a chalcopyrite structure, and it is also called a chalcopyrite-based compound semiconductor (or as a CIS-based compound semiconductor). Examples of the aforementioned Group I-III-VI compound semiconductor include $Cu(In,Ga)Se_2$ (also called GIGS), $Cu(In,Ga)(Se,S)_2$ (also called CIGSS), and $CuInS_2$ (also called CIS). $Cu(In,Ga)$ $Se_2$ is a compound mainly containing Cu, In, Ga, and Se. Further, $Cu(In,Ga)(Se,S)_2$ is a compound mainly containing Cu, In, Ga, Se, and S.

Figure 2:
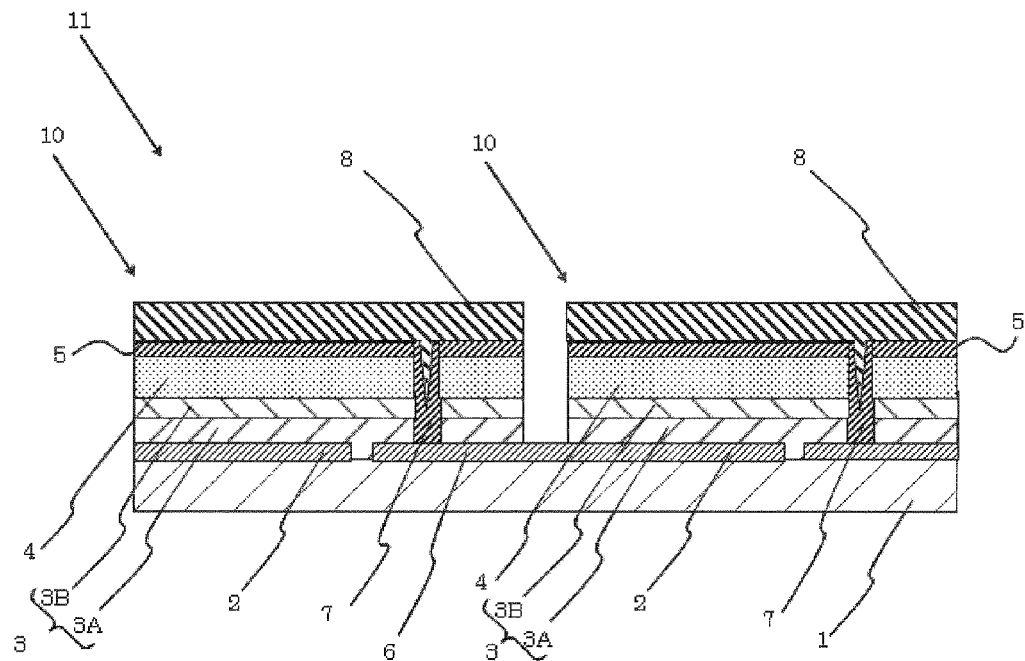
FIG. 2 is a sectional view showing an example of the embodiment of the photoelectric conversion device.
Figure 3:
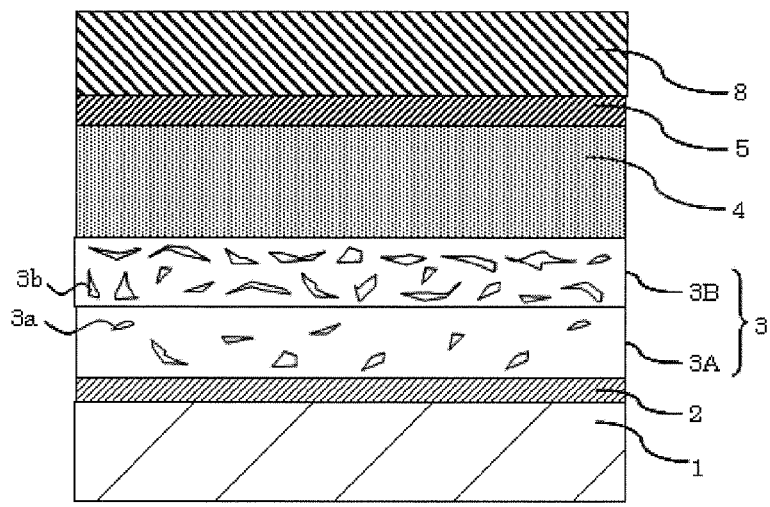
FIG. 3 is a schematic sectional view for explaining the embodiment of the photoelectric conversion device.

In the present embodiment, the light absorbing layer 3 includes semiconductor layers of several types. As an example, the light absorbing layer 3 includes a first layer 3A close to the first electrode layer 2, and a second layer 3B provided on the first layer 3A as shown in FIG. 2. Further, voids are formed in the first and second layers 3A and 3B. In the present embodiment, the void ratio of the first layer 3A of the light absorbing layer 3 is lower than that of the second layer 3B of the light absorbing layer 3 as shown in FIG. 3. To be specific, in the present embodiment, the first layer 3A provided on the first electrode layer 2 includes a small number of voids 3a so it is a relatively dense layer. This increases force of the light absorbing layer 3 to contact the first electrode layer 2, so that the light absorbing layer 3 is unlikely to peel off the first electrode layer 2. As a result, the reliability of the photoelectric conversion device 10 is increased. Additionally, the aforementioned close contact between the first electrode layer 2 and the light absorbing layer 3 makes it possible to lower a resistance at an interface between the first electrode layer 2 and the light absorbing layer 3. This enhances photoelectric conversion efficiency.

Further, in the present embodiment, more voids (voids 3b) are formed in the second layer 3B of the light absorbing layer 3 than in the first layer 3A. So, light having entered the light absorbing layer 3 is easily trapped in the light absorbing layer 3. Thus, the light having entered the light absorbing layer 3 is allowed to contribute to photoelectric conversion efficiently, so that the present embodiment is allowed to enhance photoelectric conversion efficiency.

The void ratio of each semiconductor layer in the light absorbing layer 3 can be measured by image processing of a photograph of a sectional view captured with an electron microscope, for example. More specifically, binarized photographs of sectional views in black and white are captured at arbitrarily determined plural cross sections of the light absorbing layer 3, and then void ratios can be calculated based on their occupied areas. Or, a specific surface area may be determined by a BET specific surface area measurement. Then, like a void ratio, the resultant specific surface area may be employed as an index. In the a BET specific surface area measurement, a specific surface area may be measured while the light absorbing layer 3 is cut in a direction of the thickness thereof by a technique such as etching, for example.

The void ratio of the first layer 3A of the light absorbing layer 3 may be in a range of from 0 to 20%. This further increases force of the light absorbing layer 3 to contact the first and third electrode layers 2 and 6. This range allows reduction of a resistance value at an interface between the light absorbing layer 3, and the first and third electrode layers 2 and 6, thereby increasing a current density. The voids 3a are provided in the first layer 3A in the embodiment illustrated in FIG. 3 and other drawing. Meanwhile, the first layer 3A may include substantially no voids 3a. Further, the void ratio of the second layer 3B of the light absorbing layer 3 may be in a range of from 30 to 80%. This allows light having entered the light absorbing layer 3 to be trapped in the light absorbing layer 3 more effectively. The light absorbing layer 3 in this condition can relax stress generated in the second layer 3B, so that a crack and the like generated in the light absorbing layer 3 can be reduced. The void ratio of the light absorbing layer 3 changes largely at an interface between the first and second layers 3A and 3B. So, this interface can be found in the following manner, for example. A void ratio is plotted in a direction of the thickness of the light absorbing layer 3. If the void ratio changes steeply, and the rate of the change becomes maximum or minimum at some position, this position is determined as the interface.

Figure 4:
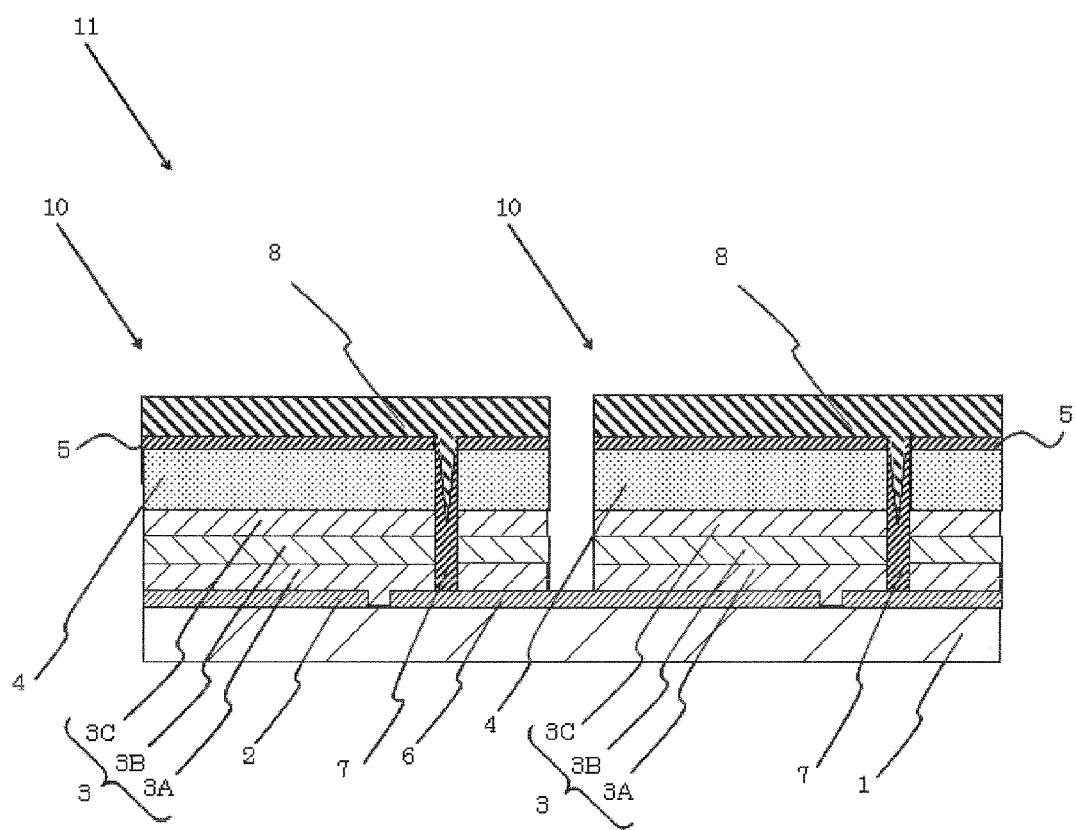
FIG. 4 is a sectional view showing an example of a different embodiment of the photoelectric conversion device.

As shown in FIG. 4, the light absorbing layer 3 may include a third layer 3C provided on the second layer 3B. The third layer 3C of the light absorbing layer 3 may have a void ratio lower than that of the second layer 3B of the light absorbing layer 3 as shown in FIG. 5. At this time, the third layer 3C of the light absorbing layer 3 adheres to the buffer layer 4. To be specific, the buffer layer 4 is provided on the third layer 3C of the light absorbing layer 3. In this mode, the third layer 3C includes a small number of voids 3c so it is a relatively dense layer. This makes favorable junction between the light absorbing layer 3 and the buffer layer 4 to enhance photoelectric conversion efficiency. Further, this mode increases contact force between the light absorbing layer 3 and the buffer layer 4. This makes it difficult for the second electrode layer 5 or the power collecting electrodes 8 to get in between the light absorbing layer 3 and the buffer layer 4. Thus, generation of a leakage current between the light absorbing layer 3 and the buffer layer 4 can be reduced. Additionally, the third layer 3C of the light absorbing layer 3 does not have many voids, so that projections and recesses in a surface of the third layer 3C directly contacting the buffer layer 4 are reduced. As a result, the buffer layer 4 and the second electrode layer 5 are formed easily.

The void ratio of the third layer 3C of the light absorbing layer 3 may be in a range of from 0 to 20%. This range increases force to contact the buffer layer 4, so that photoelectric conversion efficiency and reliability are enhanced further.

Figure 6A:
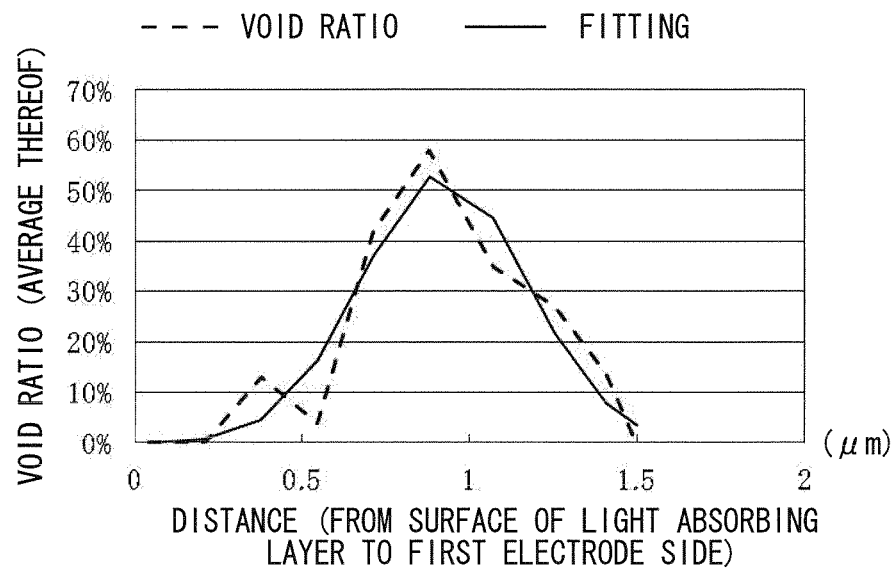
FIGS. 6A and 6B are explanatory views for explaining a relationship between the void ratio of a light absorbing layer and each layer in the light absorbing layer.

The positions of interfaces between the layers (first to third layers) of the light absorbing layer 3 can be determined in the following manner, for example. First, image processing is performed on three equally sized regions defined by dividing the light absorbing layer 3 in a direction of the thickness thereof (direction in which the layers are stacked). Then, part with voids and part without the voids are each binarized into black and white to be converted to a numerical value, thereby determining a void ratio. Next, as shown in FIG. 6A, the void ratio in the form of a numerical value is plotted with a horizontal axis representing a distance in the direction in which the layers of the light absorbing layer 3 are stacked (dashed line of FIG. 6A). At this time, a larger numerical value on the horizontal axis of FIG. 6A means a shorter distance to the first electrode layer 2, whereas a smaller numerical value on the horizontal axis means a shorter distance to the buffer layer 4. So, a value being zero on the horizontal axis indicates a surface of the light absorbing layer 3 on the buffer layer 4 side.

Figure 6B:
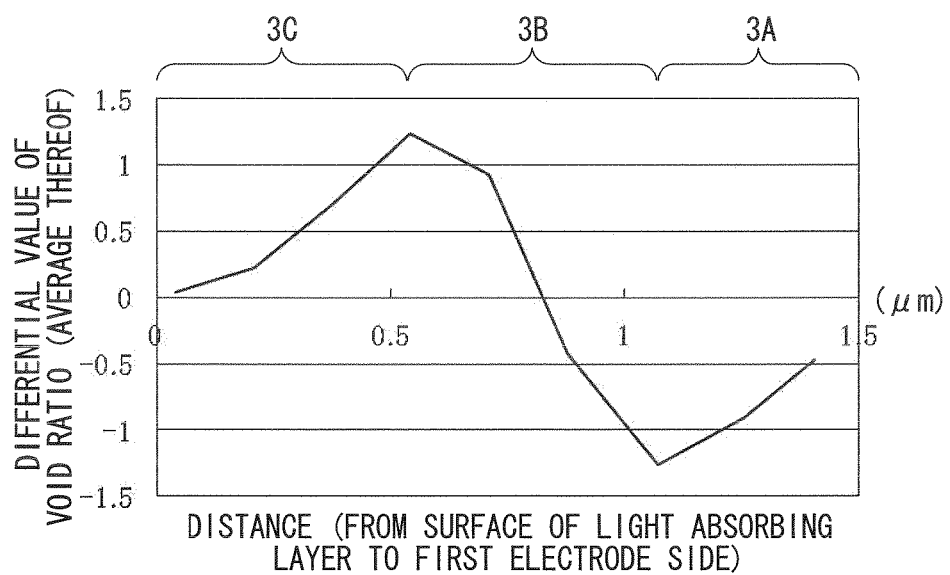

Next, peaks forming a distribution of the void ratio are fitted by Gaussian function as shown in FIG. 6A. A fitting parameter is obtained by the method of least squares. Next, the fitted data is differentiated and then plotted as shown in FIG. 6B. At this time, a position where a differential value becomes maximum corresponds to an interface between part of a low void ratio and part of a high void ratio. To be specific, in the present embodiment, the position where the differential value becomes maximum corresponds to an interface between the third and second layers 3C and 3B as shown in FIG. 6B. Further, a position where the differential value becomes minimum corresponds to an interface between part of a high void ratio and part of a low void ratio. To be specific, in the present embodiment, the position where the differential value becomes minimum corresponds to an interface between the second and first layers 3B and 3A as shown in FIG. 6B. As described above, the light absorbing layer 3 is divided into the layers at a position where the rate of change of the void ratio is at a maximum or minimum. So, each layer of the light absorbing layer 3 may be comprised of a plurality of layers having substantially the same void ratio. To be specific, the first layer 3A may be comprised of a plurality of layers.

The light absorbing layer 3 may have a thickness of from 1 to 2.5 µm in order to enhance photoelectric conversion efficiency. In this condition, the first layer 3A of the light absorbing layer 3 has a thickness of from 0.2 to 1 µm. Meanwhile, the second and third layers 3B and 3C each have a thickness of from 0.5 to 1.5 µm.

The light absorbing layer 3 in this condition is formed by the following method (method A), for example. First, a Group I-B element such as Cu, a Group III-B element such as In and Ga, and a Group VI-B element such as Se and S, are supplied by vapor deposition and the like on the substrate 1 on which the first electrode layer 2 is formed, thereby forming the first layer 3A of the light absorbing layer 3 (step A1). The first layer 3A is formed in the step A1 at temperatures of from 500 to 600° C., for example. Next, the Group I-B element, the Group III-B element, and the Group VI-B element are supplied while the first layer 3A is heated by being irradiated with a lamp or a laser through a surface thereof, thereby forming the second layer 3B (step A2). The second layer 3B is formed in the step A2 at temperatures of, for example, from 300 to 500° C. lower than the temperatures at which the first layer 3A is formed in the step A1. As a result of application of this method, grain growth of the materials to form each layer of the light absorbing layer 3 is controlled, thereby forming the first and second layers 3A and 3B having different void ratios. For provision of the third layer 3C, the Group I-B element, the Group III-B element, and the Group VI-B element are supplied while the second layer 3B is heated by being irradiated with a lamp or a laser through a surface thereof after the step A2, thereby forming the third layer 3C (step A3). The third layer 3C is formed in the step A3 at temperatures of, for example, from 500 to 600° C. higher than the temperatures at which the second layer 3B is formed in the step A2. This method allows formation of the third layer 3C denser than the second layer 3B.

The light absorbing layer 3 can also formed by the following method (method B). First, a Group I-B element, a Group III-B element, and a Group VI-B element are supplied by vapor deposition and the like on the substrate 1 on which the first electrode layer 2 is formed. At this time, these materials are supplied while the light absorbing layer 3 is heated and reduced in temperature by being irradiated with a lamp or a laser through a surface of a light absorbing layer 3 being formed, thereby forming the light absorbing layer 3. The light absorbing layer 3 is formed in this step at temperatures of from 300 to 600° C., for example. As a result of application of this method, the first and second layers 3A and 3B having different void ratios are formed. For successive formation of the third layer 3C, the third layer 3C may be formed by supplying the aforementioned materials at an increased temperature after formation of the second layer 3B.

The light absorbing layer 3 can also be formed by the following method (method C). First, a Group I-B element and a Group III-B element are supplied by sputtering and the like on the substrate 1 on which the first electrode layer 2 is formed, thereby forming a precursor (step C1). Next, the precursor is heated in an atmosphere containing a Group VI-B element to form the first layer 3A of the light absorbing layer 3 (step C2). The first layer 3A is formed in the step C2 at temperatures of from 500 to 600° C., for example. Then, the Group I-B element, the Group III-B element, and the Group VI-B element are supplied by sputtering and the like while the first layer 3A is heated by being irradiated with a lamp or a laser through a surface thereof, thereby forming the second layer 3B (step C3). The second layer 3B is formed in the step C3 at temperatures of, for example, from 300 to 500° C. lower than the temperatures at which the first layer 3A is formed in the step C1. This method allows formation of the first and second layers 3A and 3B having different void ratios. For provision of the third layer 3C, the Group I-B element, the Group III-B element, and the Group VI-B element are supplied by sputtering and the like while the second layer 3B is heated by being irradiated with a lamp or a laser through a surface thereof, thereby forming the third layer 3C (step C4). The third layer 3C is formed in the step C4 at temperatures of, for example, from 500 to 600° C. higher than the temperatures at which the second layer 3B is formed in the step C3. This method allows formation of the third layer 3C denser than the second layer 3B.

In the aforementioned step C2, the first layer 3A may also be formed by depositing Se on a surface of the precursor, and thereafter, heating the precursor in an inert atmosphere of nitrogen or argon, for example.

The light absorbing layer 3 can also be formed by the following method (method D). First, a material solution containing a Group I-B element, a group III-B element, and a Group VI-B element is applied on the substrate 1 on which the first electrode layer 2 is formed, thereby forming a first precursor (step D1). Next, the first precursor is subjected to calcination (heat treatment) to form a first calcined precursor (step D2). The first calcined precursor is formed in the step D2 at temperatures of from 200 to 300° C. Then, the first calcined precursor is heated in an atmosphere containing the group VI-B element or an inert atmosphere of nitrogen, argon or the like, thereby forming the first layer 3A of the light absorbing layer 3 (step D3). The first layer 3A is formed in the step D3 at temperatures of from 500 to 600° C. Next, a material solution containing the Group I-B element, the group III-B element, and the Group VI-B element is applied on the first layer 3A, thereby forming a second precursor (step D4). The second precursor is subjected to calcination (heat treatment) to form a second calcined precursor (step D5). The second calcined precursor is formed in the step D5 at temperatures of from 200 to 300° C. Then, the second calcined precursor is heated in an atmosphere containing the group VI-B element or an inert atmosphere of nitrogen, argon or the like, thereby forming the second layer 3B (step D6). The second layer 3B is formed in the step D6 at temperatures of, for example, from 300 to 500° C. lower than the temperatures at which the first layer 3A is formed in the step D3. This method allows formation of the first and second layers 3A and 3B having different void ratios. For provision of the third layer 3C, a material solution containing the Group I-B element, the group III-B element, and the Group VI-B element is applied on the second layer 3B, thereby forming a third precursor (step D7). The third precursor is subjected to calcination (heat treatment) to form a third calcined precursor (step D8). The third calcined precursor is formed in the step D8 at temperatures of from 200 to 300° C. Next, the third calcined precursor is heated in an atmosphere containing the group VI-B element or an inert atmosphere of nitrogen, argon or the like, thereby forming the third layer 3C (step D9). The third layer 3C is formed in the step D9 at temperatures of, for example, from 500 to 600° C. higher than the temperatures at which the second layer 3B is formed in the step D6. This method allows formation of the third layer 3C denser than the second layer 3B. Calcination of the precursors in the steps D2, D5 and D8 may be omitted.

The temperature at which each layer of the light absorbing layer 3 is formed in the aforementioned methods A to D is the temperature of an atmosphere in each step. Meanwhile, in each of the methods, the temperatures at which the first and second layers 3A and 3B are formed may be the temperature of the substrate 1 itself. Controlling the temperature of the substrate 1 is easier than controlling the temperature of an atmosphere. Further, application method shown in the method D makes steps of manufacturing the light absorbing layer 3 easier than those of the other methods.

A material solution used in the method including application method may contain a Group I-B metal, a Group III-B metal, a chalcogen element-containing organic compound, and a Lewis base organic solvent. The Group I-B metal and the Group III-B metal can dissolve well in a solvent containing the chalcogen element-containing organic compound and the Lewis base organic solvent (hereinafter also called a mixed solvent S). This mixed solvent S allows formation of a material solution where a total concentration of the Group I-B metal and the Group III-B metal is 6% by mass or more of the mixed solvent S. Use of this mixed solvent S is capable of increasing a degree of solubility of the aforementioned metals, making it possible to obtain a high-concentration material solution. The material solution is described in detail below.

The chalcogen element-containing organic compound is an organic compound containing a chalcogen element. The chalcogen element corresponds to S, Se and Te belonging to the Group VI-B. If the chalcogen element is S, examples of the chalcogen element-containing organic compound include thiol, sulfide, disulfide, thiophene, sulfoxide, sulfone, thioketone, sulfonic acid, sulfonic acid ester, and sulfonic acid amide. Of the compounds listed here, compounds such as thiol, sulfide, and disulfide form a complex easily together with metal. If the chalcogen element-containing organic compound includes a phenyl group, the application properties of the chalcogen element-containing organic compound are enhanced. Examples of such a compound include thiophenol and diphenyl sulfide, and derivatives thereof.

If the chalcogen element is Se, examples of the chalcogen element-containing organic compound include selenol, selenide, diselenide, selenoxide, and selenone. Of the compounds listed here, compounds such as selenol, selenide, and diselenide form a complex easily together with metal. If the chalcogen element-containing organic compound is phenylselenol, phenyl selenide or diphenyl selenide each having a phenyl group, or derivatives thereof, the application properties of the chalcogen element-containing organic compound are enhanced.

If the chalcogen element is Te, examples of the chalcogen element-containing organic compound include tellurol, telluride, and ditelluride.

The Lewis base organic solvent is an organic solvent capable of forming a Lewis base. Examples of the Lewis base organic solvent include pyridine, aniline, triphenylphosphine, and derivatives thereof. If the Lewis base organic solvent has a boiling point of 100° C. or higher, the application properties of the Lewis base organic solvent are enhanced.

The Group I-B metal and the chalcogen element-containing organic compound may be chemically bonded. Moreover, the Group III-B metal and the chalcogen element-containing organic compound may be chemically bonded. Furthermore, the chalcogen element-containing organic compound and the Lewis base organic solvent may be chemically bonded. If metal, the chalcogen element-containing organic compound, the Lewis base organic solvent, and the like are chemically bonded, they occupy 8% by mass or more to provide a higher-concentration material solution as described above. The aforementioned chemical bonds may be achieved by coordinate bonds between the elements, for example. These chemical bonds can be confirmed for example by NMR (nuclear magnetic resonance) method. The NMR method may detect a chemical bond between the Group I-B metal and the chalcogen element-containing organic compound as a peak shift of multinuclear NMR of the chalcogen element. The NMR method may detect a chemical bond between the Group III-B metal and the chalcogen element-containing organic compound as a peak shift of multinuclear NMR of the chalcogen element. Further, the NMR method may detect a chemical bond between the chalcogen element-containing organic compound and the Lewis base organic solvent as a shift of a peak derived from the organic solvent. The number of moles in the chemical bond between the Group I-B metal and the chalcogen element-containing organic compound may be in a range of from 0.1 to 10 times the number of moles in the chemical bond between the chalcogen element-containing organic compound and the Lewis base organic solvent.

The mixed solvent S may be prepared by mixing the chalcogen element-containing organic compound and the Lewis base organic solvent such that the mixed solvent S is in a liquid form at room temperatures. This facilitates handling of the mixed solvent S. As a ratio to achieve this condition, the chalcogen element-containing organic compound in an amount of 0.1 to 10 times the amount of the Lewis base organic solvent may be mixed with the Lewis base organic solvent. This forms the aforementioned chemical bonds favorably to obtain a high-concentration solution of the Group I-B metal and the Group III-B metal.

The material solution may be formed by making the Group I-B metal and the Group III-B metal dissolve directly in the mixed solvent S, for example. This way allows reduction of mixing of impurities except components of the compound semiconductor into the light absorbing layer 3. Either the Group I-B metal or the Group III-B metal may be metal salt. Making the Group I-B metal and the Group III-B metal dissolve directly in the mixed solvent S means mixing a raw metal of a single metal or a raw metal of an alloy directly with the mixed solvent S, and making the raw metal dissolve in the mixed solvent S. So, the raw metal of a single metal or that of an alloy is not required to be changed once to a different compound (for example, metal salt such as chloride) before it dissolves in the solvent. This process simplifies steps and allows reduction of mixing of impurities except the elements to form the light absorbing layer 3 into the light absorbing layer 3. So, the light absorbing layer 3 is given enhanced purity.

The Group I-B metal is Cu or Ag, for example. The Group I-B metal may include one element, or elements of two or more types. If Group I-B metal elements of two or more types are used, a mixture of the Group I-B metals of two or more types may be made to dissolve at one time in the mixed solvent S. Or, the Group I-B metals of corresponding elements may be made to dissolve in the mixed solvent S separately, and then mixed.

The Group III-B metal is Ga or In, for example. The Group III-B metal may include one element, or elements of two or more types. If Group III-B metal elements of two or more types are used, a mixture of the Group III-B metals of two or more types may be made to dissolve at one time in the mixed solvent S. Or, the Group III-B metals of corresponding elements may be made to dissolve in the mixed solvent S separately, and then mixed.

The compound semiconductor in the light absorbing layer 3 may contain In and Ga. In this case, the molar ratio of In/(In+Ga) of the first layer 3A may be lower than that of the second layer 3B. This mode produces BSF (back surface field) effect easily to allow increase of a current density. Thus, photoelectric conversion efficiency is enhanced further in this mode.

If the light absorbing layer 3 includes the third layer 3C, the molar ratios of In/(In+Ga) of the first and third layers 3A and 3C may be both lower than that of the second layer 3B. This mode produces BSF effect in a region from the second layer 3B to the first layer 3A to allow increase of a current density of an output current. Additionally, this mode places the third layer 3C with a relatively large band gap near a pn junction at an interface between the light absorbing layer 3 and the buffer layer 4 to allow increase of an output voltage. Thus, photoelectric conversion efficiency is enhanced further in this mode.

Meanwhile, if the light absorbing layer 3 includes the third layer 3C, the molar ratios of In/(In+Ga) of the first and second layers 3A and 3B may be both lower than that of the third layer 3C. This mode produces BSF effect easily to allow increase of a current density. Thus, photoelectric conversion efficiency is enhanced further in this mode.

The aforementioned molar ratio of In/(In+Ga) of each layer of the light absorbing layer 3 may be measured by energy dispersive x-ray spectroscopy (EDS) while cross sections are observed with an electron microscope, for example. Or, the molar ratio of In/(In+Ga) may be measured by x-ray photoelectron spectroscopy (XPS) while the light absorbing layer 3 is cut by sputtering in a direction of the depth thereof (direction in which layers of the light absorbing layer are stacked). Or, the molar ratio of In/(In+Ga) may be measured by Auger electron spectroscopy (AES). For formation of the aforementioned layers having different molar ratios of In/(In+Ga), the molar ratios may be controlled by adjusting the amounts of In and Ga contained in a material gas or a material solution during formation of each of the layers, for example.

The light absorbing layer 3 may contain Na (sodium). In this case, the molar concentration of Na in the first layer 3A of the light absorbing layer 3 may be lower than that in the second layer 3B of the light absorbing layer 3. This can reduce generation of a heterogeneous phase to be formed between the first electrode layer 2 and Na, so that reduction of photoelectric conversion efficiency is reduced. In this case, the molar concentration of Na in the first layer 3A is 1 mole percent or less, for example. Meanwhile, the molar concentration of Na in the second layer 3B is from 2 to 5 mole percent, for example. The molar concentration of Na is lower in the first layer 3A than in the second layer 3B by 2 to 5 mole percent.

If the light absorbing layer 3 includes the third layer 3C, the molar concentration of Na in the third layer 3C of the light absorbing layer 3 may be lower than that in the second layer 3B. This can reduce deterioration of consistency of a heterogeneous phase formed between the elements in the compound semiconductor and Na with the buffer layer 4.

The molar concentration of Na in the light absorbing layer 3 can be measured by the aforementioned processes employed to measure the molar ratio of In/(In+Ga). For supply of Na into the light absorbing layer 3, the substrate 1 comprised of soda-lime glass may be used, and Na contained in this substrate 1 may be diffused into the light absorbing layer 3, for example. In this case, Na is deposited easily on surfaces of the voids existing in the light absorbing layer 3. So, the amount of Na in each layer (each of the first to third layers 3A to 3C) of the light absorbing layer 3 can be set by above mentioned control of the void ratio of each layer. To be specific, a layer of a low void ratio contains a small amount of Na.

In the photoelectric conversion device 10, the buffer layer 4 is formed on the light absorbing layer 3. The buffer layer 4 is a semiconductor layer to form a heterojunction (pn junction) together with the light absorbing layer 3. So, a pn junction is formed at an interface or near the interface between the light absorbing layer 3 and the buffer layer 4. In the present embodiment, the light absorbing layer 3 is a p-type semiconductor, and the buffer layer 4 is an n-type semiconductor accordingly. The buffer layer 4 is capable of reducing a leakage current further if it has a resistivity of 1 Ω·cm or higher. The buffer layer 4 may be comprised of CdS, ZnS, ZnO, $In_2S_3$, In(OH,S), (Zn,In)(Se,OH), (Zn,Mg)O or the like, for example. The buffer layer 4 may be formed by chemical bath deposition (CBD) method or the like, for example. In(OH,S) is a compound mainly containing In, OH, and S. (Zn,In)(Se,OH) is a compound mainly containing Zn, In, Se, and OH. (Zn,Mg)O is a compound mainly containing Zn, Mg, and O. The buffer layer 4 is capable of enhancing the absorption efficiency of the light absorbing layer 3 if it has properties of transmitting light in a wavelength region to be absorbed by the light absorbing layer 3.

If the buffer layer 4 contains indium (In), the second electrode layer 5 may contain indium oxide. This allows reduction of change of an electrical conductivity to be caused by inter-diffusion of elements between the buffer layer 4 and the second electrode layer 5. The light absorbing layer 3 may be comprised of a chalcopyrite based material containing indium. In this mode, the light absorbing layer 3, the buffer layer 4, and the second electrode layer 5 contain indium, so that change of an electrical conductivity and change of a carrier concentration to be caused by interdiffusion of elements between the layers can be reduced.

The buffer layer 4 is capable of enhancing the resistance to moisture of the photoelectric conversion device 10 if it mainly contains a Group III-VI compound. The Group III-VI compound is a compound of a Group III-B element and a Group VI-B element. Mainly containing the Group III-VI compound means that the concentration of the Group III-VI compound in the buffer layer 4 is 50 mole percent or more. The concentration of the Group III-VI compound in the buffer layer 4 may be 80 mole percent or more. Additionally, the buffer layer 4 may contain 50 atomic percent or less of Zn. This enhances the resistance to moisture of the photoelectric conversion device 10. The buffer layer 4 may also contain 20 atomic percent or less of Zn.

The buffer layer 4 may have a thickness of from 10 to 200 nm, for example. Or, the buffer layer 4 may have a thickness of from 100 to 200 nm. This makes it possible to effectively reduce decrease of photoelectric conversion efficiency particularly under high temperature and high humidity conditions.

The second electrode layer 5 is a transparent conducting film of from 0.05 to 3.0 µm comprised of ITO (indium tin oxide), ZnO or the like, for example. The second electrode layer 5 is formed by sputtering method, vapor deposition method, chemical vapor deposition (CVD) method or the like. The second electrode layer 5 has a resistivity lower than that of the buffer layer 4, and is provided to extract electric charges generated in the light absorbing layer 3. The second electrode layer 5 is capable of extracting electric charges well if it has a resistivity of lower than 1 Ω·cm and a sheet resistance of 50Ω per square or lower.

In order to enhance the absorption efficiency of the light absorbing layer 3 further, the second electrode layer 5 may have properties of transmitting light well to be absorbed by the light absorbing layer 3. The second electrode layer 5 may have a thickness of from 0.05 to 0.5 µm. This enhances the properties of the second electrode layer 5 to transmit light and allows the second electrode layer 5 to reduce light reflection. Further, the second electrode layer 5 is capable of enhancing light scattering effect and favorably transmitting a current generated as a result of photoelectric conversion. Additionally, if the second electrode layer 5 and the buffer layer 4 have substantially the same index of refraction, reflection of light at an interface between the second electrode layer 5 and the buffer layer 4 can be reduced.

The second electrode layer 5 may mainly contain a Group III-VI compound. This enhances the resistance to moisture of the photoelectric conversion device 10. Mainly containing the Group III-VI compound means that the concentration of the Group III-VI compound in the second electrode layer 5 is 50 mole percent or more. The concentration of the Group III-VI compound in the second electrode layer 5 may be 80 mole percent or more. Additionally, the concentration of Zn in the second electrode layer 5 may be 50 atomic percent or less. This enhances the resistance to moisture of the photoelectric conversion device 10. The concentration of Zn in the second electrode layer 5 may also be 20 atomic percent or less.

In the photoelectric conversion device 10, part corresponding to an aggregate of the buffer layer 4 and the second electrode layer 5, namely, part placed between the light absorbing layer 3 and the power collecting electrodes 8 may mainly contain a Group III-VI compound. Mainly containing the Group III-VI compound means that the Group III-VI compound (if the Group III-VI compound includes several types of compounds, a total thereof) occupies 50 mole percent or more of a compound forming the part corresponding to the aggregate of the buffer layer 4 and the second electrode layer 5. The Group III-VI compound may occupy 80 mole percent or more. The concentration of Zn in the part corresponding to the aggregate of the buffer layer 4 and the second electrode layer 5 may be 50 atomic percent or less. This enhances the resistance to moisture of the photoelectric conversion device 10. The concentration of Zn in the part corresponding to the aggregate of the buffer layer 4 and the second electrode layer 5 may also be 20 atomic percent or less.

The photoelectric conversion device 10 is electrically connected through the connecting conductor 7 to an adjacent photoelectric conversion device 10. This establishes series connection between a plurality of the photoelectric conversion devices 10 to form the photoelectric conversion module 11.

The connecting conductor 7 connects the second electrode layers 5 and the third electrode layer 6. In other words, the connecting conductor 7 connects the second electrode layer 5 of one of the photoelectric conversion devices 10 and the first electrode layer 2 of the other photoelectric conversion device 10 adjacent to the former photoelectric conversion device 10. The connecting conductor 7 is provided to divide each of the light absorbing layers 3 of the adjacent photoelectric conversion devices 10. As a result, electricity generated by photoelectric conversion in each of the light absorbing layers 3 can be extracted as a current through the series connection. The connecting conductor 7 may be formed together with the second electrode layer 5 in the same step to be integral with the second electrode layer 5. So, the connecting conductor 7 can be formed in a simple step. This way provides favorable electrical connection between the connecting conductor 7 and the second electrode layers 5 to increase reliability.

The power collecting electrodes 8 function to reduce the electrical resistance of the second electrode layer 5. This makes it possible to extract a current efficiently generated in the light absorbing layer 3. As a result, the power generation efficiency of the photoelectric conversion device 10 is enhanced.

As an example, the power collecting electrodes 8 have a linear shape extending from one edge of the photoelectric conversion device 10 to the connecting conductor 7 as shown in FIG. 1. So, electric charges generated as a result of photoelectric conversion in the light absorbing layer 3 are collected by the power collecting electrodes 8 through the second electrode layer 5. The electric charges thereby collected are transferred through the connecting conductor 7 to the adjacent photoelectric conversion device 10. So, even if the second electrode layer 5 has a small thickness, provision of the power collecting electrodes 8 makes it possible to extract a current efficiently generated in the light absorbing layer 3. Thus, power generation efficiency is enhanced.

The linear power collecting electrodes 8 may have a width of from 50 to 400 µm, for example. This makes it possible to maintain conductivity without involving excessive reduction of a light receiving area of the light absorbing layer 3. The power collecting electrodes 8 may have a plurality of branching sections branching off the power collecting electrodes 8.

As an example, the power collecting electrodes 8 are formed by using metal paste made by diffusing powder of metal such as Ag in a resin binder and the like. The power collecting electrodes 8 are formed by printing the metal paste into a desirable pattern by screen printing and the like, and then curing the metal paste, for example.

The power collecting electrodes 8 may contain solder. This can increase resistance to bending stress and reduce a resistance further. The power collecting electrodes 8 may contain metals of two types or more having different melting points. In this case, the power collecting electrodes 8 may be formed by being heated at a temperature at which at least a metal of one type is melted and a metal of at least one different type is not melted, and cured. As a result, the metal having a lower melting point is melted first to increase the density of the power collecting electrodes 8. Thus, the resistance of the power collecting electrodes 8 is reduced. Meanwhile, the metal having a higher melting point acts to maintain the shape of the power collecting electrodes 8.

The power collecting electrodes 8 may be provided to reach the outer circumferential edge of the light absorbing layer 3 in plan view. In this mode, the power collecting electrodes 8 protect the outer circumferential part of the light absorbing layer 3, so that generation of a crack can be reduced at the outer circumferential part of the light absorbing layer 3. So, this mode allows photoelectric conversion even at the outer circumferential part of the light absorbing layer 3. Additionally, this mode allows the power collecting electrodes 8 to extract a current efficiently generated at the outer circumferential part of the light absorbing layer 3. As a result, power generation efficiency is enhanced in this mode.

Also, the outer circumferential part of the light absorbing layer 3 can be protected in this mode, so that a total of the thicknesses of members provided between the first electrode layer 2 and the power collecting electrodes 8 can be reduced. So, the amount of members can be reduced. Further, the light absorbing layer 3, the buffer layer 4, and the second electrode layer 5 corresponding to the aforementioned members can be formed in a shortened period of a step. A total of the thicknesses of the light absorbing layer 3, the buffer layer 4, and the second electrode layer 5 may be from 1.56 to 2.7 µm, for example. More specifically, the thickness of the light absorbing layer 3 is from 1 to 2.5 µm. The thickness of the buffer layer 4 is from 0.01 to 0.2 µm. Further, the thickness of the second electrode layer 5 is from 0.05 to 0.5 µm.

In this mode, edge surfaces of the power collecting electrodes 8, and edge surfaces of the second electrode layer 5 and the light absorbing layer 3 may be in the same plane at the outer circumferential edge of the light absorbing layer 3. This makes it possible to favorably extract a current generated as a result of photoelectric conversion at the outer circumferential edge of the light absorbing layer 3. The power collecting electrodes 8 are not always required to reach the outer circumferential edge of the light absorbing layer 3 when the power collecting electrodes 8 are seen in plan view. If a distance between the outer circumferential edge of the light absorbing layer 3 and edge portions of the power collecting electrodes 8 does not exceed 1000 μm, generation of a crack starting from the outer circumferential edge of the light absorbing layer 3 and development of such a crack can be reduced.

The invention is not limited to the embodiment described above, but various modifications can certainly be devised without departing from the scope of the invention.

REFERENCE NUMERALS

1 Substrate
2 First electrode layer
3 Light absorbing layer
3A First layer
3B Second layer
3C Third layer
3a, 3b, 3c Void
4 Buffer layer
5 Second electrode layer
6 Third electrode layer
7 Connecting conductor
8 Power collecting electrode
10 Photoelectric conversion device
11 Photoelectric conversion module

The invention claimed is:

1. A photoelectric conversion device, comprising an electrode layer, and
a light absorbing layer located on the electrode layer, the light absorbing layer containing a Group I-III-VI compound semiconductor, and
a semiconductor layer located on the light absorbing layer, wherein the light absorbing layer comprises a first layer close to the electrode layer, a second layer located on the first layer, and a third layer located on the second layer, the third layer forming a pn junction together with the semiconductor layer, and
the first layer has a void ratio lower than that of the second layer, and the third layer has a void ratio lower than that of the second layer.

2. The photoelectric conversion device according to claim 1, wherein the first layer has a void ratio of from 0 to 20%, and the second layer has a void ratio of from 30 to 80%, and the third layer has a void ratio of from 0 to 20%.

3. The photoelectric conversion device according to claim 1, wherein
the compound semiconductor contains In and Ga, and
the molar ratio of In/(In+Ga) of the first layer is lower than that of the second layer.

4. The photoelectric conversion device according to claim 1, wherein the first and second layers further contain Na, and the molar concentration of Na in the first layer is lower than that in the second layer.

5. The photoelectric conversion device according to claim 1, wherein
the compound semiconductor contains In and Ga, and
the molar ratios of In/(In+Ga) of the first and third layers are lower than that of the second layer.

6. The photoelectric conversion device according to claim 1, wherein
the compound semiconductor contains In and Ga, and
the molar ratios of In/(In+Ga) of the first and second layers are lower than that of the third layer.

7. The photoelectric conversion device according to claim 1, wherein the third layer further contains Na, and the molar concentration of Na in the third layer is lower than that in the second layer.

* * * * *